(12) United States Patent
Chang et al.

(10) Patent No.: US 6,380,569 B1
(45) Date of Patent: Apr. 30, 2002

(54) HIGH POWER UNIPOLAR FET SWITCH

(75) Inventors: Hsueh-Rong Chang, Thousand Oaks; Rajesh Gupta, Newbury Park, both of CA (US)

(73) Assignee: Rockwell Science Center, LLC, Thousand Oaks, CA (US)

(*) Notice: Subject to any disclaimer, the term of this patent is extended or adjusted under 35 U.S.C. 154(b) by 0 days.

(21) Appl. No.: 09/371,741

(22) Filed: Aug. 10, 1999

(51) Int. Cl.$^7$ ............................................. H01L 29/80
(52) U.S. Cl. .................. 257/256; 257/107; 257/263; 257/328; 257/329
(58) Field of Search .................. 257/256, 300, 257/107, 263, 328, 329

(56) References Cited

U.S. PATENT DOCUMENTS

| | | | |
|---|---|---|---|
| 4,791,462 A | * 12/1988 | Blanchard et al. | 357/23.4 |
| 4,835,586 A | * 5/1989 | Cogan et al. | 357/23.14 |
| 4,872,044 A | * 10/1989 | Nishizawa et al. | 357/38 |
| 4,903,189 A | * 2/1990 | Ngo et al. | 363/127 |
| 5,168,331 A | * 12/1992 | Yilmaz | 257/331 |
| 5,175,598 A | * 12/1992 | Nishizawa et al. | 257/107 |
| 5,304,821 A | * 4/1994 | Hagino | 257/133 |
| 5,323,040 A | * 6/1994 | Baliga | 257/332 |
| 5,350,934 A | * 9/1994 | Matsuda | 257/139 |
| 5,471,075 A | * 11/1995 | Shekar et al. | 257/139 |
| 5,488,236 A | * 1/1996 | Baliga et al. | 257/132 |
| 5,661,322 A | * 8/1997 | Williams et al. | 257/331 |
| 5,702,962 A | * 12/1997 | Terasawa | 437/40 |
| 5,856,692 A | * 1/1999 | Williams et al. | 257/335 |
| 5,909,039 A | * 6/1999 | Bakowski et al. | 257/139 |
| 5,917,216 A | * 6/1999 | Floyd et al. | 257/330 |
| 5,969,378 A | * 10/1999 | Singh | 257/77 |
| 6,091,107 A | * 7/2000 | Amaratunga et al. | 257/331 |
| 6,194,741 B1 | * 2/2001 | Kinzer et al. | 257/77 |

FOREIGN PATENT DOCUMENTS

WO 92 14269 8/1992

OTHER PUBLICATIONS

Tan et al. High-Voltage Accumulation-Layer UMOSFET's in 4H-SiC, pp. 487-489. IEEE Electron Device Letters, vol. 19, No. 12, Dec. 1998.*

(List continued on next page.)

*Primary Examiner*—Eddie Lee
*Assistant Examiner*—Eugene Lee
(74) *Attorney, Agent, or Firm*—Koppel, Jacobs, Patrick & Heybl

(57) ABSTRACT

A high power unipolar FET switch has an N- drift layer; a layer of metal contacts the drift layer via an ohmic contact to provide a drain connection for the FET. Each switch cell has a pair of trenches recessed into the drift layer and separated by a mesa region. Oxide layers line the walls and bottom of each trench, which are each filled with a conductive material; the conductive material in each trench is connected together to provide a gate connection for the FET. A shallow P region extends from the bottom of each trench into the drift layer and around the trench corners. A layer of metal contacts the mesa region via an ohmic contact to provide a source connection for the FET. The structure preferably operates as a "normally-off" device, with the potentials created by the work function difference between the conductive material and the N- mesa region completely depleting the mesa region. A positive gate voltage undepletes the mesa regions, creates accumulation channels adjacent to the oxide side-walls of the trenches, and modulates the mesa region, thereby turning the switch on and allowing current to flow between drain and source via the mesa region and the accumulation channels. The switch's unipolar structure enables the device to exhibit a fast switching speed with very low switching losses.

47 Claims, 7 Drawing Sheets

OTHER PUBLICATIONS

Comparsion of Ultralow Specific On–Resistance UMOS-FET Structures: The ACCUFET, EXTFET, INFET, and Conventional UMOSFET's, Tsengyou Syau et al., IEEE Transactions on Electron Devices (May 1994).

Baliga, B. Jayant. Power Semiconductor Devices, pp 426 and 575–577. Boston, MA:PWS Publishing Company, 1996.

Lorenz et al. Improved MOSFET An Important Milestone Toward a New Power MOFET Generation, pp 14–22. PCIM, Sep. 1998.

Tan et al. High–Voltage Accumulation–Layer UMOSFET's in 4H–SiC, pp 487–489. IEEE Electron Device letters, vol. 19, No. 12, Dec. 1998.

* cited by examiner

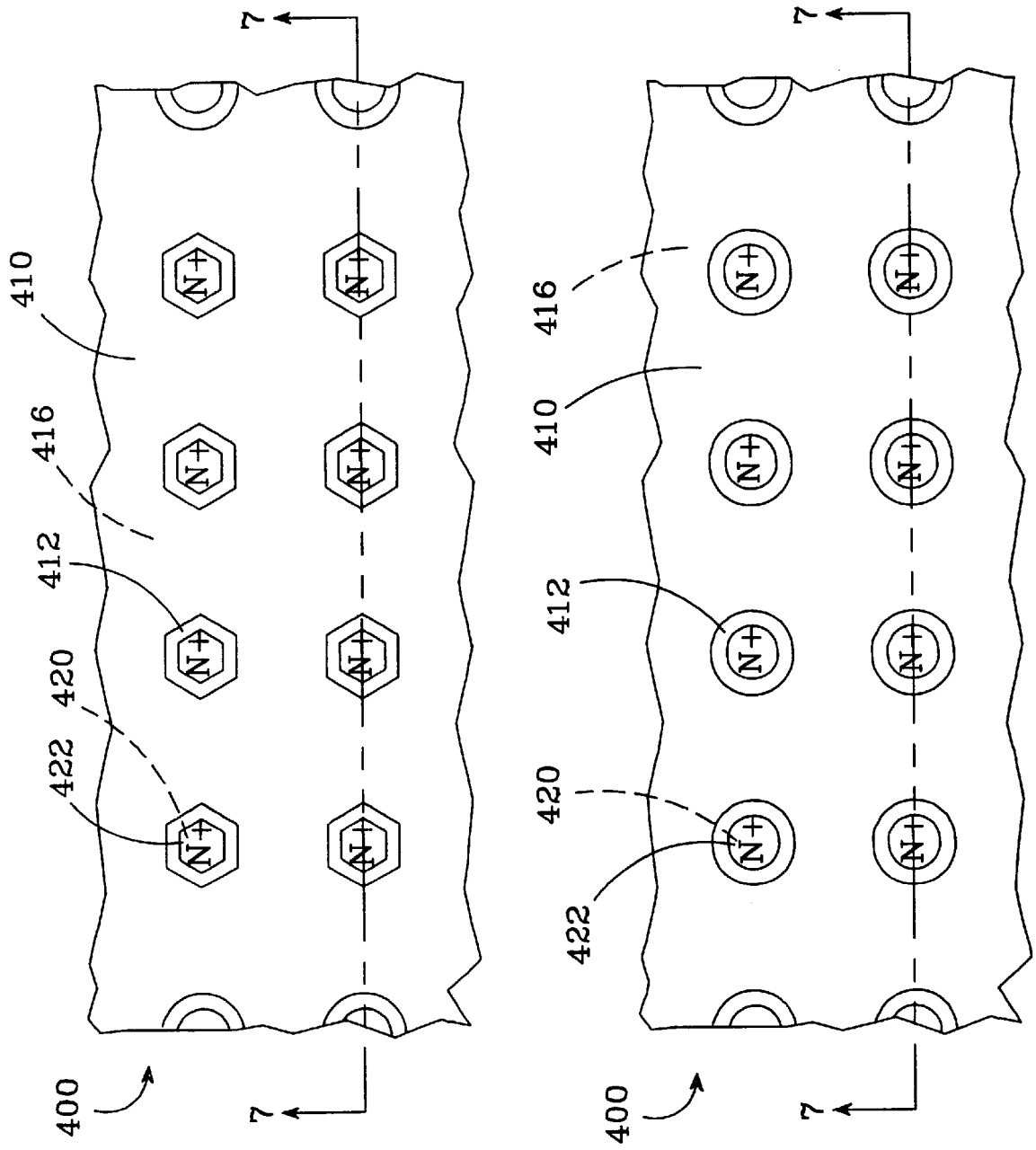

HIGH POWER UNIPOLAR FET SWITCH

BACKGROUND OF THE INVENTION

1. Field of the Invention

This invention relates to the field of high power semiconductor switches.

2. Description of the Related Art

Semiconductor devices are increasingly required to accommodate high currents and/or high voltages without failing. Many high power applications call for the use of a semiconductor switch which is required to conduct a large current when turned on, and to block a high voltage when off.

One device used in such applications is the power metal-oxide-semiconductor field-effect transistor (MOSFET). As discussed in J. Baliga, *Power Semiconductor Devices*, PWS Publishing Co. (1996) at p. 426, a power MOSFET exhibits excellent fast switching capability and safe-operating-area. When designed to block relatively low voltages (less than 200 volts), the power MOSFET has a low on-resistance. However, on-resistance increases very rapidly when its breakdown voltage is increased. This makes the on-state power losses unacceptable where high DC supply voltages are used.

One approach to improving blocking voltage while maintaining a low on-resistance is discussed in L. Lorenz et al., "Improved MOSFET—An Important Milestone Toward a New Power MOSFET Generation", PCIM (Sept. 1998), pp. 14–22. This device inserts rectangular p-doped regions into the drift layer. When turned off, the rectangular p-type structures cause the reverse voltage to be built up not only vertically, but horizontally as well, resulting in a 3-D folded structure. This enables a reduction in layer thickness while obtaining an increase in blocking voltage.

The improved MOSFET described above suffers from several drawbacks, however. The fabrication of the device is very tedious and complex, and therefore costly, requiring multiple photolithography, implantation, and epitaxial growth steps. Furthermore, the maximum blocking voltage demonstrated to date has been 600 volts rendering the device unusable for many applications which require higher supply voltages.

Another approach which has been explored to improve blocking voltage while maintaining low on-resistance has been the fabrication of FETs using silicon carbide (SiC). SiC has a wider bandgap than does silicon, giving it a "critical electric field" —i.e., the peak electric field that a material can withstand without breaking down—that is an order of magnitude higher than that of silicon (Si). This allows much higher doping and a much thinner drift layer for a given blocking voltage, resulting in a very low specific on-resistance in SiC-based devices.

Unfortunately, SiC devices developed to date exhibit severe commercialization constraints. One such device is described in "High-Voltage Accumulation-Layer UMOSFET's in 4H-SiC", IEEE Electron Device Letters, Vol. 19, No. 12 (December 1998), pp. 487–489. This SiC-based device employs a UMOS structure, with an accumulation channel formed on the sidewalls of the trench by epitaxial growth to attain enhancement mode operation. It requires an additional epitaxial layer under the p-base to promote current spreading and achieve low on-resistance. The doping levels and the thicknesses of the sidewall epilayer and the epilayer under the p-base must be tightly controlled to achieve an enhancement mode device with low on-resistance. These demands result in a very complex fabrication process which is unsuitable for large-scale manufacturing.

SUMMARY OF THE INVENTION

A high power unipolar field-effect transistor (FET) switch is presented which overcomes the problems noted above. The switch is particularly well-suited to high power switching applications, providing a very low on-resistance, a high blocking voltage, and negligible switching loss.

An N– drift layer is on an N+ layer which provides an ohmic contact to the drift layer (X+ denotes a carrier concentration of at least $1 \times 10^{18}/cm^3$, X– denotes a carrier concentration of less than $5 \times 10^{16}/cm^3$). A layer of metal on the N+ layer provides a drain connection for the FET. A pair of trenches are recessed into the drift layer opposite the N+ layer; the trenches are separated by a mesa region comprised of that portion of the N– drift layer found between the trenches. Oxide layers line the walls and bottom of each trench, which are each filled with a conductive material. A second layer of metal connects the conductive material in each of the trenches together to provide a gate connection for the FET. A shallow P region extends from the bottom of each trench into the drift layer and around the corners formed at the intersections of its respective trench's oxide side-walls and its oxide bottom. A second N+ layer is on the N– drift layer within the mesa region which provides an ohmic contact to the mesa region, and a third layer of metal contacts the second N+ layer to provide a source connection for the FET.

The structure is preferably arranged so that the switch operates as a "normally-off" device; i.e., current is prohibited from flowing between drain and source when the voltage applied to the gate connection is zero. This is accomplished by making the width and doping concentration of the mesa region such that, with no voltage applied to the gate, the mesa region is completely depleted by the potentials created by the work function difference between the conductive material and the N+ material in the mesa region. The structure can also be arranged to operate as a "normally-on" device by making the mesa region so wide or its doping concentration so high that a negative gate voltage is required to completely deplete the mesa region.

When a positive gate voltage is applied, the mesa region is undepleted and accumulation channels are created adjacent to the oxide side-walls of the trenches. The gate voltage modulates the N– drift layer within the mesa region, thereby turning the switch on and allowing current to flow between the drain and the source connections via the mesa region and the accumulation channels.

The creation of the accumulation channels, in combination with the modulation of the mesa region and the use of ohmic contacts, enables the unipolar FET switch to have a low on-resistance. Since the device is unipolar, there are no minority carriers to recombine during turn-off, and thus the device's switching speed can be very fast. This also enables the switch to exhibit very low switching losses—i.e., very little power is dissipated when transitioning from an on-state to an off-state. The shallow P regions surrounding the lower corners of the trench structures protect the corners from high electric fields and thereby increase the switch's breakdown voltage and enhance the reliability of the trench oxide.

The switch's N– drift and N+ layers may be conventional silicon (Si), but are preferably made from semiconductor materials having a bandgap voltage higher than that of silicon, such as silicon carbide (SiC), gallium nitride (GaN), gallium arsenide (GaAs), or diamond. A material's critical field is proportional to its bandgap voltage. Thus, the use of a wide bandgap material enables the use of a drift layer that, for the same blocking voltage, is much thinner than would be necessary with an Si implementation—an order of magnitude thinner for an SiC implementation. Furthermore, the doping concentration a material is capable of attaining is proportional to its critical field. Thus, these higher-critical-field materials also permit the drift region's doping density to be much higher than an Si version capable of providing the same blocking voltage (an order of magnitude higher for an SiC implementation), which further reduces the device's on-resistance to very low level. Use of a wide bandgap material also enables the device's reverse leakage current to be several orders of magnitude less than a comparable Si device, which serves to increase the temperature at which the switch can be operated.

The doping concentration in the mesa region is preferably less than it is in the portion of the N− drift layer below the mesa region. This makes it easier to completely deplete the mesa region, which in turn enables the use of a wider and easier to fabricate mesa region. However, due to the presence of the accumulation channels across the mesa region when the switch is on, the lower doping concentration has only a minor effect on the device's on-resistance.

A number of structures are fabricated in parallel to provide a desired current carrying capacity. Devices per the present invention can carry currents of 50 A with a reverse blocking voltage in excess of 1200 volts, on a die size of only 0.1 cm². These characteristics make the novel FET switch well-suited for high power applications.

Further features and advantages of the invention will be apparent to those skilled in the art from the following detailed description, taken together with the accompanying drawings.

BRIEF DESCRIPTION OF THE DRAWINGS

FIG. 3 is a sectional view of the switch of FIG. 1, illustrating its operation when on.

FIG. 9a is a plan view of another embodiment of a multiple-cell implementation of a switch per the present invention.

FIG. 9b. is a plan view of yet another possible embodiment of a multiple-cell implementation of a switch per the present invention.

DETAILED DESCRIPTION OF THE INVENTION

Figure 1:
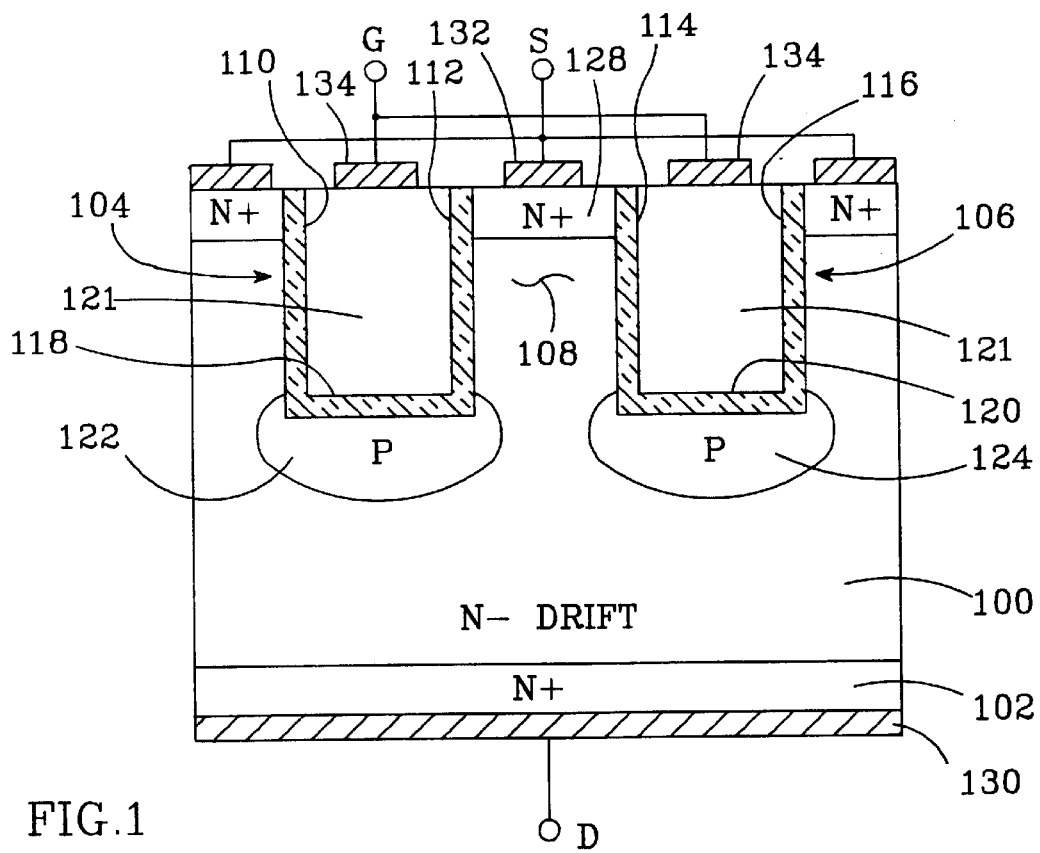
FIG. 1 is a sectional view of one embodmient of a FET switch per the present invention.

An exemplary embodiment of a unipolar FET switch in accordance with the present invention is shown in FIG. 1. A N− drift layer 100 of a desired thickness is on a first N+ layer 102. Recessed into drift layer 100 opposite the N+ layer are a pair of trenches 104, 106, which are separated by a mesa region 108 comprised of that portion of the N− drift layer found between the trenches. Each of the trenches has oxide side-walls 110, 112, 114, 116 and oxide bottoms 118, 120, and is filled with a conductive material 121. At the bottom of each trench is a shallow P region 122, 124, which extends around the corners formed at the intersections of its respective trench's oxide side-walls and its oxide bottom. A second N+ layer 128 is on N− drift layer 100 within mesa region 108.

The first N+ layer 102 provides an ohmic contact to drift layer 100, and a first layer of metal 130 on N+ layer 102 provides a drain connection for the FET switch. The second N+ layer 128 provides an ohmic contact to mesa region 108, and a second layer of metal 132 on N+ layer 128 provides a source connection for the switch. A third layer of metal 134 contacts the conductive material 121 in each of the trenches, providing a gate connection for the FET switch.

Figure 2:
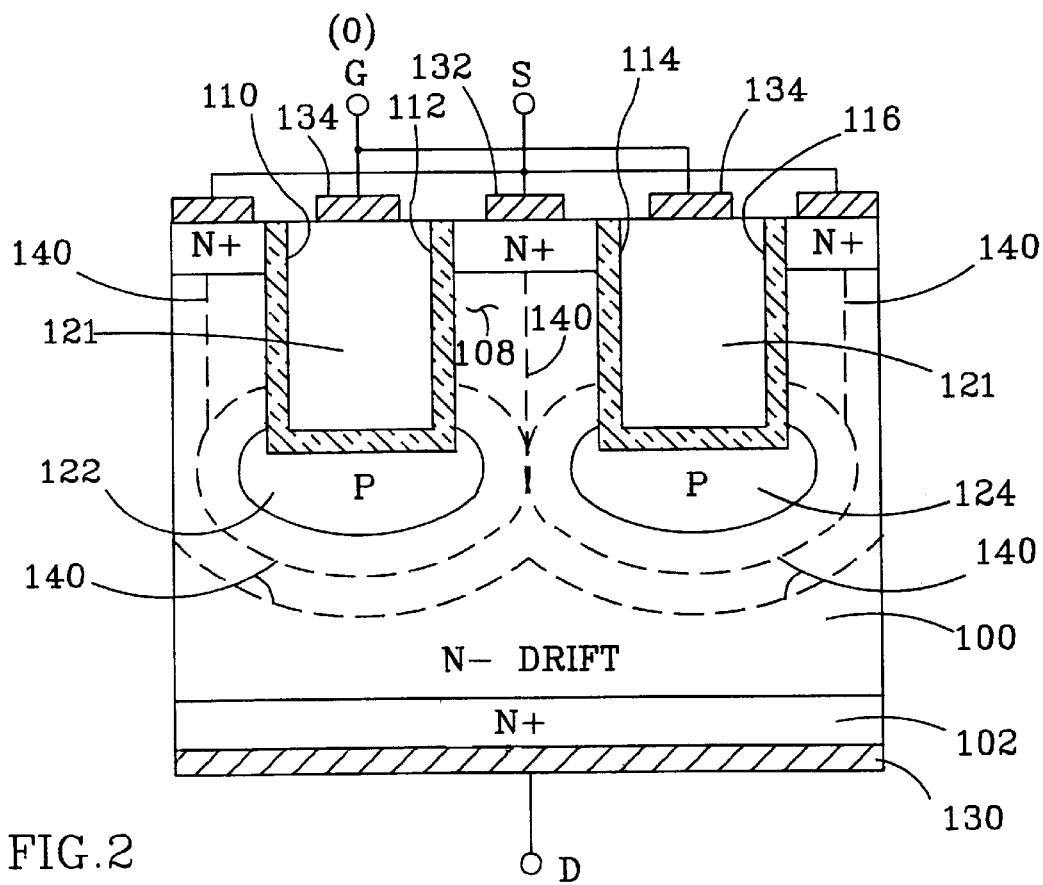
FIG. 2 is a sectional view of the switch of FIG. 1, illustrating its operation when off.

The structure of the novel switch is preferably arranged so that it is normally off. This is illustrated in FIG. 2 for the switch of FIG. 1. The width and doping concentration of the mesa region 108 are established such that, with no voltage applied to the gate connection 134, the mesa region is completely depleted by the potentials created by the work function difference between the conductive material 121 and the N+ material in the mesa region. The depletion regions 140 formed around each P region 122, 124 and adjacent to the oxide sidewalls 110, 112, 114, 116 merge in mesa region 108 to form a potential barrier for electrons, preventing the flow of current between drain 130 and source 132.

Alternatively, the switch can be arranged so that it is normally on. If the mesa region is made sufficiently wide, the work function difference between the conductive material 121 and the N+ material in the mesa region will not completely deplete the mesa region, allowing current to flow between drain 130 and source 132. When so configured, a negative voltage must be applied to gate 134 in order to completely deplete the mesa region and turn the device off. While functional, this arrangement is generally not preferred because power is required to hold the device off.

Figure 3:
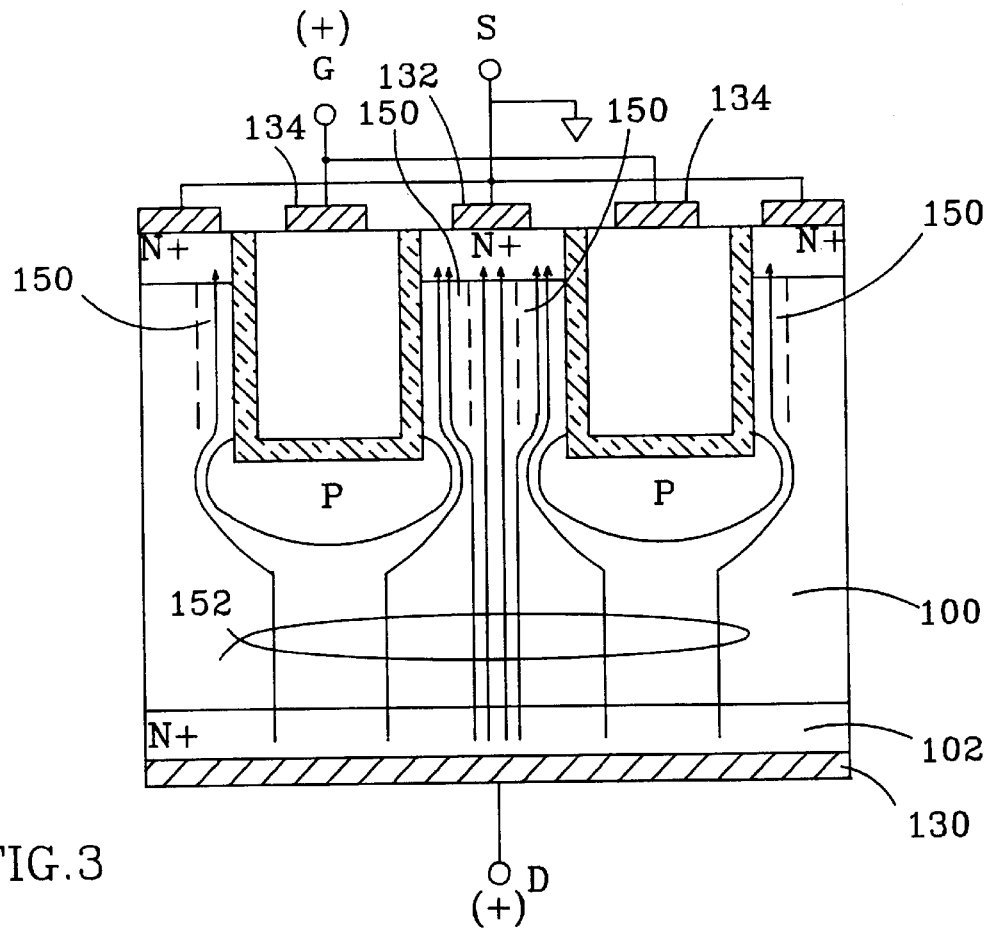
Figure 4:
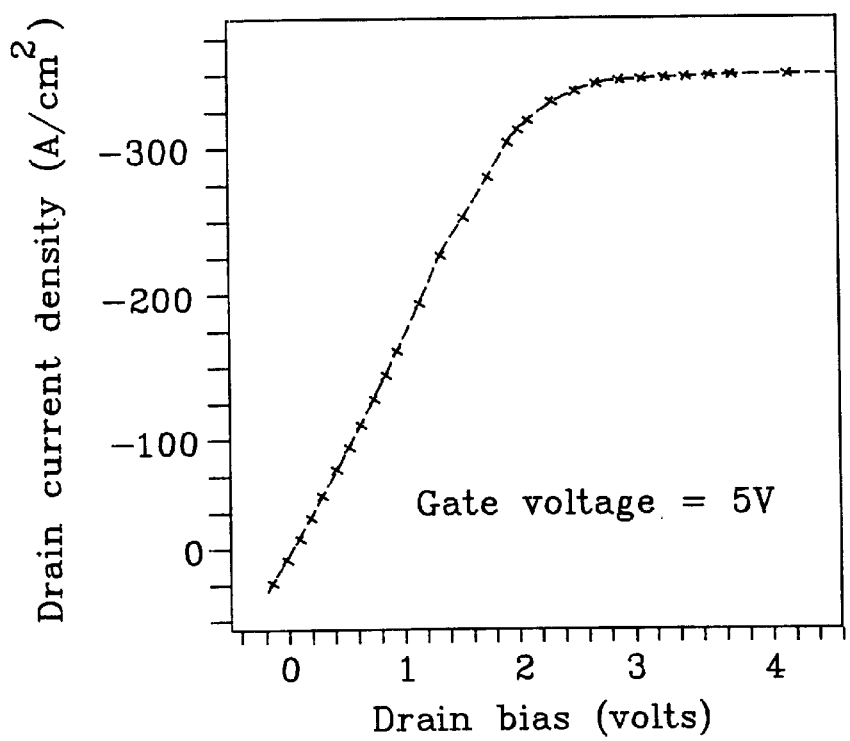
FIG. 4 is a graph plotting drain current density vs. drain bias for a FET switch per the present invention.

FIG. 3 illustrates how the switch of FIG. 1, when configured to be normally off, is turned on. A positive voltage is applied to the gate connection 134. The positive gate voltage undepletes the mesa region 108, creates accumulation channels 150 adjacent to the oxide side-walls 110, 112, 114, 116, and modulates the N− drift layer 100 within the mesa region, thereby turning the switch on and enabling current 152 to flow between the drain and source via the mesa region and the accumulation channels. A simulated plot of the on-state characteristics of the novel switch is shown in FIG. 4, which plots drain current density versus drain bias for a gate voltage of 5 volts.

A normally-on version of the switch conducts current when the gate voltage is zero. However, as with a normally-off switch, the application of a positive gate voltage creates accumulation channels and modulates the mesa region, which significantly lowers on-resistance and enables the conduction of a much higher current.

The presence of the accumulation channels, the use of N+ ohmic contacts, and the modulation of the N− drift layer in the mesa region, combine to provide the switch with a low on-resistance. As the novel switch is unipolar, there is no recombination of carriers needed to turn-off the device. This makes the switch's reverse recovery time negligible, and enables it to switch from an on-state to an off-state very quickly. Furthermore, with voltage overshoot and reverse current virtually eliminated by the unipolar structure, very little power is dissipated when transitioning from an on-state to an off-state. As a result, the switch's switching losses are very low.

The trenches are preferably recessed vertically into the N− drift region; i.e., with their side-walls approximately perpendicular to the top surface of the drift layer 100. However, the invention is not limited to vertically-recessed trenches: each trench may be wider at the top than it is at the bottom, or vice versa. Trenches that are wider at the top than at the bottom make the mesa region wider between the trench bottoms, which tends to lower the switch's on-resistance but may degrade its blocking voltage. Trenches that are wider at the bottom constrict the mesa region, which may increase on-resistance but improve blocking voltage. Vertically-recessed trenches provide a good balance between on-resistance and blocking voltage, and are preferred.

Referring back to FIG. 1: for a normally-off switch, the conductive material 121 in trenches 104 and 106 is required to, by virtue of its work function difference with the N− material in the mesa region, create the potentials needed to completely deplete mesa region 108. Conductive material 121 is preferably polysilicon which has been heavily-doped with acceptors. Polysilicon is preferred because it easily fills the trenches, but other materials that can fill the trenches and provide good conductivity could also be used, as long as the work function difference between the material and the N+ material in the mesa region is sufficient to completely deplete the mesa region. A metal could also be used for conductive material 121, as long as it has a higher work function than the N+ material in the mesa region; metals are generally not preferred, however, as it is difficult to completely fill a trench with a metal.

When the switch is required to have a high blocking voltage (i.e., greater than about 300 volts), its N+ and N− drift layers are preferably made from a semiconductor material having a bandgap voltage that is higher than that of silicon (Si), such as silicon carbide (SiC), gallium nitride (GaN), gallium arsenide (GaAs), or diamond. The peak electric field that a material can withstand without breaking down, i.e., its "critical field", is proportional to its bandgap voltage. Thus, an SiC layer, for example, is able to sustain a peak field that is about 10 times greater than that supportable by an Si layer of comparable thickness.

Furthermore, the doping concentration a material is capable of attaining is proportional to its critical field. Thus, SiC's higher critical field enables the switch's material layers to have a doping concentration that is an order of magnitude higher than is possible with Si ($\sim 5\times10^{15}$ vs. $\sim 8\times 10^{13}$ carriers/cm$^3$). For example, a switch with a 1200 volt blocking voltage could be provided with a drift layer made from Si having a doping density of about $8\times10^{13}$ carriers/cm$^3$ which is about 120 $\mu$m thick, or with an SiC drift layer having a doping density of about $5\times10^{15}$ carriers/cm$^3$ which is about 12 $\mu$m thick.

The higher doping concentration achievable with a wide-bandgap material, also lowers the device's on-resistance when compared with an Si implementation. A specific on-resistance of about 6 m$\Omega$-cm$^2$ at a gate voltage of 5 volts is attainable with an SiC-based switch structure as described herein.

Use of a wide-bandgap material also reduces reverse leakage current. SiC's wide bandgap enables a device's reverse leakage current to be several orders of magnitude less than an Si-based device of comparable thickness. This factor also serves to increase the temperature at which the switch can be operated. Because reverse leakage current increases exponentially with temperature, conventional devices must be operated at lower temperatures to achieve leakage currents as low as that provided by an SiC implementation. Conversely, a switch fabricated from a wide-bandgap material such as SiC can be operated at higher temperatures while still meeting a given reverse leakage current specification.

The doping concentration in the mesa region 108 is preferably less than that in the portion of the N− drift layer below the mesa region. When more lightly doped, a zero gate voltage can completely deplete a wider mesa region than would be possible if it had a higher doping concentration. This is desirable because a structure with a wider mesa region is easier to fabricate than one with a narrow mesa. Reducing the doping concentration has only a minor effect on the device's on-resistance, however, due to the accumulation channels 150 created across mesa region 108 when the switch is turned on.

The shallow P regions 122 and 124 protect the trench oxide from high electric fields. Thus, the doping of the shallow P regions should be sufficient to prevent them from becoming completely depleted when subjected to the switch's rated breakdown voltage. The activated charge needed to accomplish this varies with a material's critical field: for example, an activated charge of about $2\times10^{12}$ carriers/cm$^2$ is typically adequate for an Si switch, and a charge of about and $2\times10^{13}$ carriers/cm$_2$ should suffice for an SiC-based switch. The shallow P regions 122, 124 extend around the trench corners, to protect the corners from premature breakdown caused by high electric fields; this improves the reliability of the trench oxide and enhances the robustness of the switch's breakdown voltage characteristic. The P regions can be floating or connected to the source connection.

The P regions are preferably made shallow to limit lateral diffusion. To further limit lateral diffusion, it is preferred that the P regions comprise a slow-diffusing material. For an SiC implementation of the rectifier, the preferred material for the shallow P regions is aluminum.

Careful consideration must be given to the width of the mesa region, and the widths and depths of the trenches. For example, if a mesa is too narrow, lateral diffusion around the P regions 122, 124 may act to pinch off the conductive path and block current flow. If too wide, the reverse blocking voltage may be adversely affected (as might the operation of a normally-off version of the device). As an example, an SiC-based switch having a mesa width of about 1–2 $\mu$m, separating trenches that are each about 1–2 $\mu$m wide and 3–5 $\mu$m deep, and with an N− drift layer doped to about $1\times10^{16}$ carriers/cm$^3$, provides a low on-resistance while providing a blocking voltage of about 1200 volts. A more lightly-doped mesa region (as discussed above) would typically be doped to a density of between about $1\times10^{14}$ to $1\times10^{15}$ carriers/cm$^3$.

Figure 5:
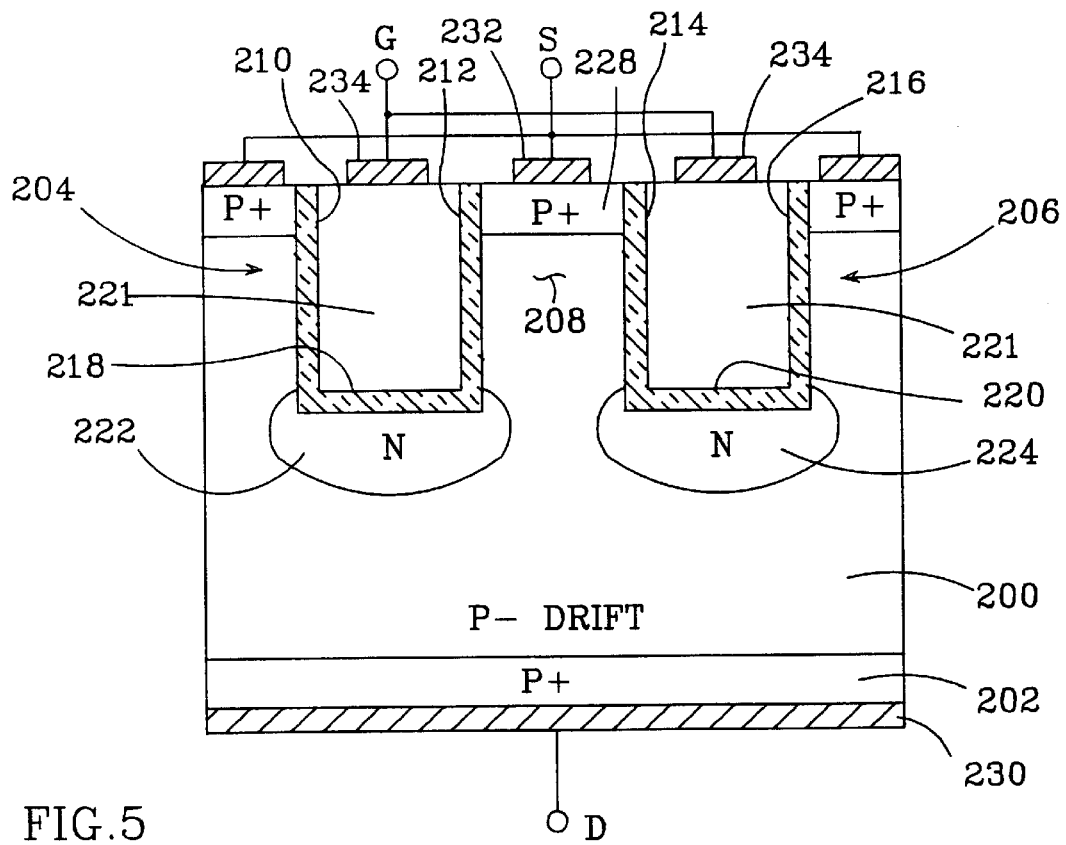
FIG. 5 is a sectional view of an opposite polarity version of the switch of FIG. 1.

The present FET switch is not limited to the structure shown in FIG. 1. An opposite polarity embodiment is shown in FIG. 5, in which each of the materials has been swapped with its opposite polarity counterpart. Here, a P– drift layer 200 is on a first P+ layer 202. A pair of trenches 204, 206 are recessed into drift layer 200 opposite P+ layer 202, and are separated by a mesa region 208. Each of the trenches has oxide side-walls 210, 212, 214, 216 and oxide bottoms 218, 220, and is filled with a conductive material 221. A shallow N region 222, 224 is at the bottom of each trench. A second P+ layer 228 is on P– drift layer 200 within a mesa region 208. First P+ layer 202 provides an ohmic contact to drift layer 200, and a first layer of metal 230 on P+ layer 202 provides a drain connection for the FET switch. The second P+ layer 228 provides an ohmic contact to mesa region 208, and a second layer of metal 232 on P+ layer 228 provides a source connection for the switch. A third layer of metal 234 contacts conductive material 221 in each of the trenches, providing a gate connection for the switch. The switch functions as before, except that the switch is turned on by applying a negative gate voltage to gate connection 234, which allows current to flow from source 232 to drain 230. The conductive material is preferably polysilicon which has been heavily-doped with donors, though other materials can also be used as long as the work function difference between the material and the P– material in the mesa region is sufficient to completely deplete the mesa region (for a normally-off switch).

Figure 6A:
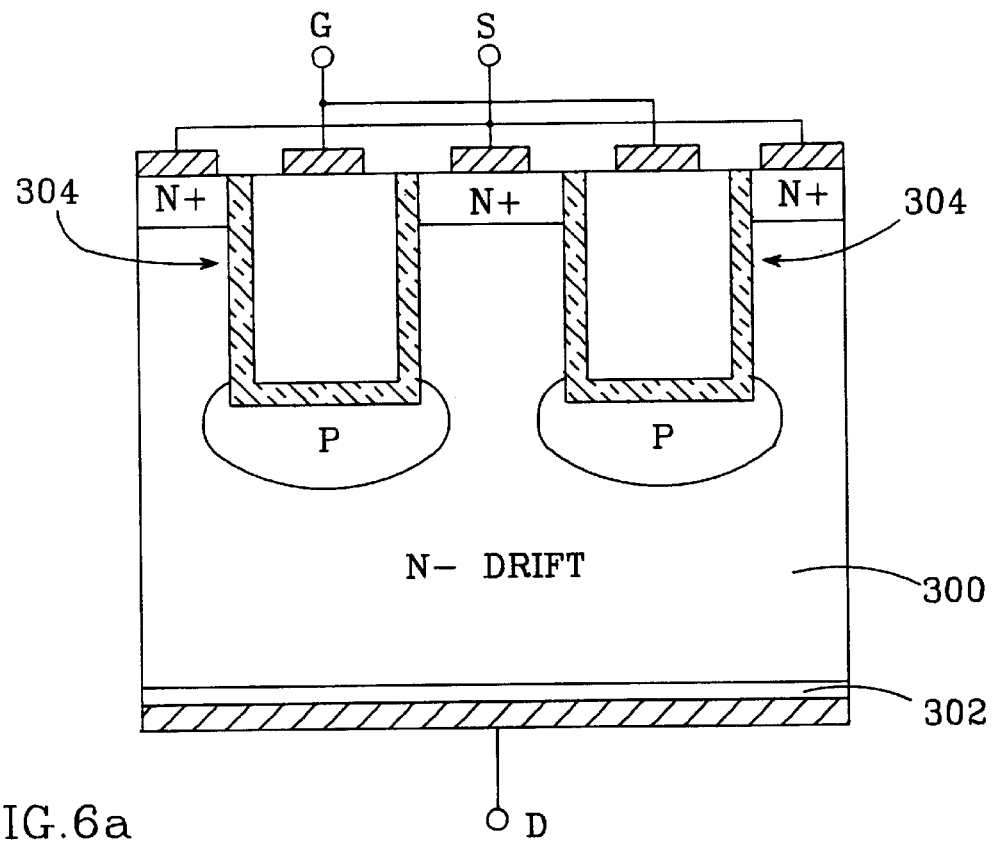
FIG. 6a is a sectional view of alternative embodiment of a switch per the present invention.

The switch can be fabricated on punch-through wafers (EPI), in which the drift layer is an epitaxial layer grown to a desired thickness on a bulk substrate material (as in FIG. 1, with epitaxial drift layer 100 on N+ bulk substrate 102), or on non-punch-through (NPT) wafers. An exemplary embodiment using an NPT wafer is shown in FIG. 6a. Here, the N– drift region 300 is a bulk substrate material, and the N+ region 302 is a very thin layer (0.5 μm or less) of a material having a large supply of donors, such as phosphorus or nitrogen, which has been implanted or diffused into the backside to provide a low resistance ohmic contact; the rest of the structure is similar to that shown in FIG. 1, with a pair of trenches 304 with oxide side-walls and bottoms and respective shallow P regions recessed into drift layer 300. Several factors should be considered when determining which wafer-type to use. EPI wafers are more expensive than NPT wafers, but because the N– epitaxial layer has a controlled thickness and doping concentration, they offer a lower on-resistance.

Figure 6B:
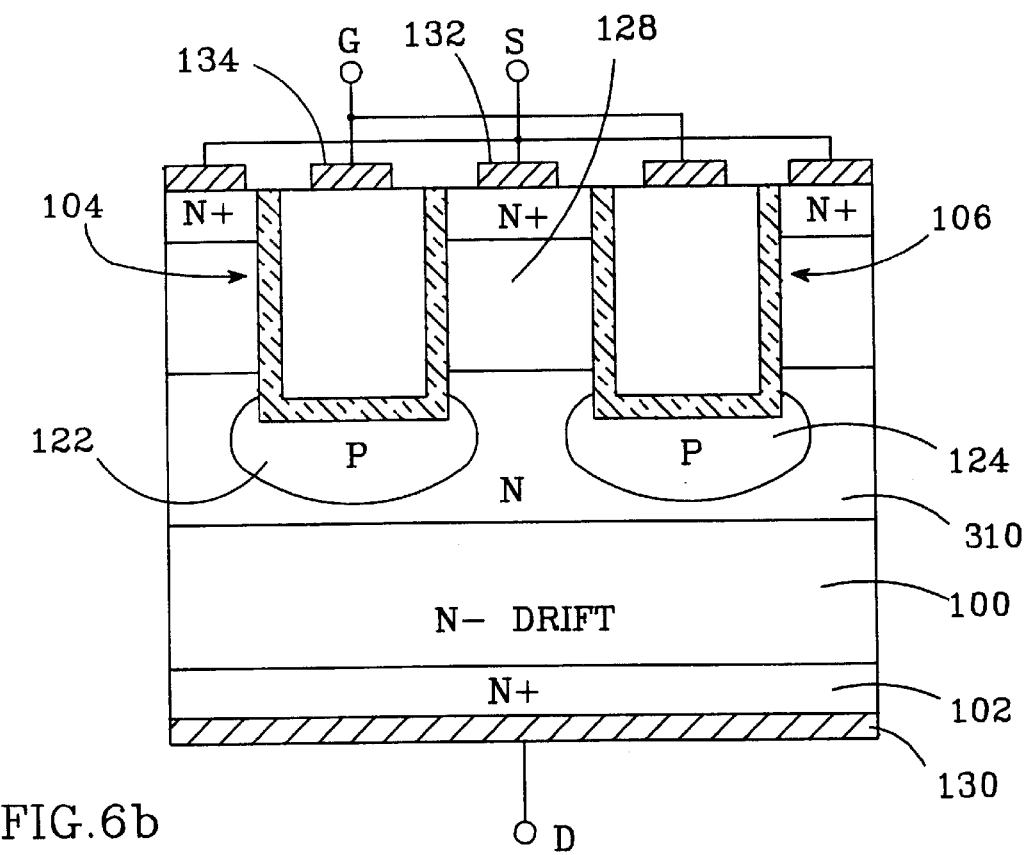
FIG. 6b is a sectional view of another alternative embodiment of a switch per the present invention.

Another possible embodiment of the switch is shown in FIG. 6b. This structure is similar to that of the device in FIG. 1, except for the addition of an N type layer 310 which completely envelops P regions 122 and 124. Because N type layer 310 is more heavily doped than N– drift layer 100, it reduces the out-diffusion of P material from P regions 122 and 124, thereby reducing the switch's on-resistance. The portion of mesa region 108 found between N type layer 310 and N+ layer 128 may be doped to the same level as the N– drift layer 100; for this embodiment, however, it is preferred that this portion of mesa region 108 be more lightly doped than N– drift layer 100 (as discussed above). The reduction in on-resistance a more lightly-doped mesa might otherwise cause is compensated for by the improved on-resistance brought about by N layer 310.

To provide a high power switch, the structures of FIGS. 1, 5, 6a, or 6b—each of which depict an individual device "cell", defined as the area from the midpoint of one trench structure to the midpoint of an adjacent trench structure, are repeated across a die having an area sufficient to provide the necessary current carrying capacity. This is illustrated in the cross-sectional view shown in FIG. 7 of an exemplary high power unipolar FET switch. A die 400 has an N– drift layer 402 on an N+ layer 404, with a metal layer 406 on layer 404 providing a drain connection; each of these layers runs approximately the full length and width of the die. A number of trench structures 408 are spaced periodically across the die, each of which has the same structure as the trenches shown in FIG. 1; i.e., filled with a conductive material 410 and having oxide side-walls 412 and bottom 414, with a shallow P region 416 at its bottom. A layer of metal 418 contacts the conductive material in each trench to provide a gate connection. Mesa regions 420 are located between each pair of trenches; an N+ layer 422 is on the N– drift material in each of the mesa regions, and a layer of metal 424 connects all of the N+ layers together to provide a source connection. A normally-on version of the switch has the same basic structure as that shown in FIG. 7, except for the use of wider mesa regions as discussed above.

The switch operates as described above, with the mesa regions 420 being completely depleted when the gate voltage is zero (for a normally-off embodiment), making the switch normally-off. When a positive gate voltage is applied, the mesa regions become undepleted and accumulation channels form adjacent to the oxide side-walls 412, allowing current to flow between drain and source via the mesa regions. Simulation results indicate that a multiple-cell switch such as that shown in FIG. 7 can accommodate current densities in excess of 500 A/cm$^2$.

The trench structures may be arrayed across the die in a wide variety of ways. One arrangement is illustrated in FIG. 8, which is a plan view that corresponds with the cross-sectional view of FIG. 7 (metal layers 406, 418, and 424 not shown for clarity). The trench structures 408 form channels that run the length of the die 400, and are spaced periodically across its width.

Figure 7:
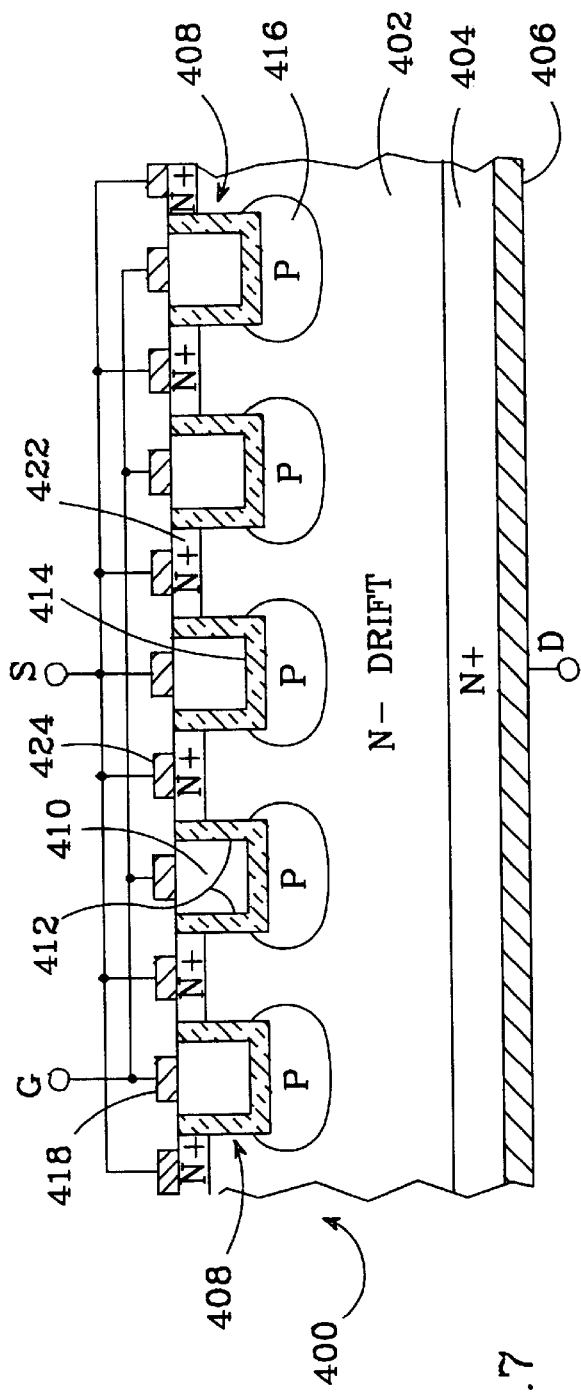
FIG. 7 is a cross-sectional view of a multiple-cell implementation of a switch per the present invention, cut along section lines 7—7 in FIGS. 8, 9a, and 9b.
Figure 8:
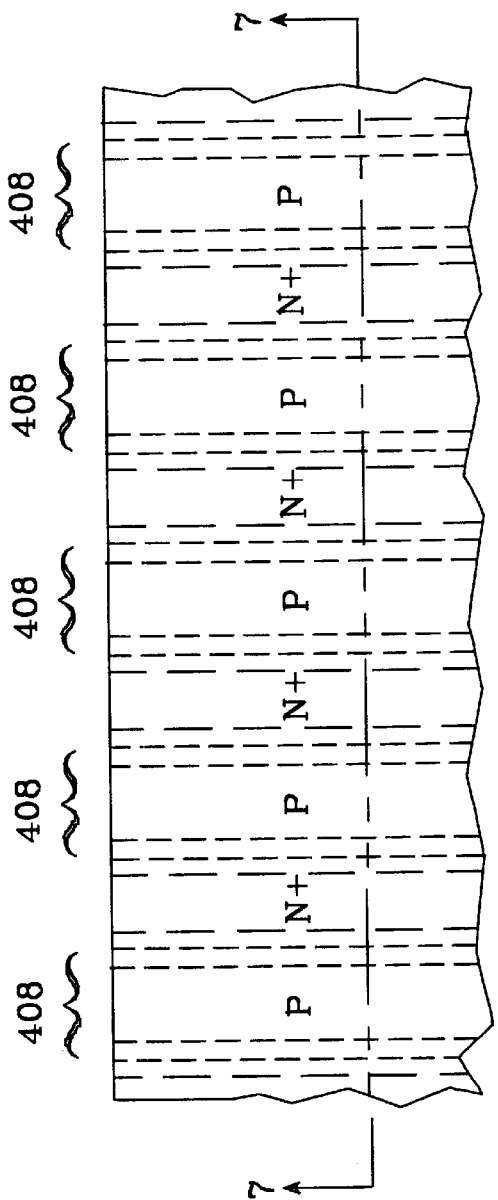
FIG. 8 is a plan view of one embodiment of a multiple-cell implementation of a switch per the present invention.

Another possible trench structure arrangement is shown in FIG. 9a, which also corresponds with the cross-sectional view of FIG. 7. Here, the N+ layers 422 and the mesa regions 420 below them are cylindrical in shape and surrounded with oxide side-walls 412, and are spaced periodically within the die 400. The trench structures conductive material 410 and the buried P regions 416 occupy the area between the cylindrical mesa regions. Note that an alternative arrangement to that shown in FIG. 9a is also possible, in which the mesa regions 420 and the trench structures 408 are reversed. The trench structures could be circular in shape and surrounded by cylindrical oxide side-walls, and spaced periodically within the die 400, with the trench structures 408 recessed in the area between the mesa regions 420.

The perimeter of each of the mesa regions or trenches may also describe a polygon. One particularly efficient example of this is shown in FIG. 9a, which also corresponds with the cross-sectional view of FIG. 7. Here, the N+ layers 422, the mesa regions 420 below them, and the oxide side-walls 412 surrounding them are hexagonal in shape, and are spaced periodically within the die 400.

The trench structure arrays shown in FIGS. 7–9b are merely exemplary; many other possible trench and mesa geometries and arrangements are possible which will result in switches that adhere to the principles of the invention. It is recommended that square-shaped trenches be avoided, because the high peak fields that appear at the trench corners can result in the premature breakdown of the device.

A "termination" typically surrounds an array of cells as described above, to protect the cells on the outer edges of the array. For the present switch, it is preferable that the termination depth extend well into the drift layer. This serves to better protect the outlying trench structures, and reduces the sharpness of the termination's corners, which enhances the termination's ability to protect the trenches from high electric fields.

When the drift layer is N type material, the termination is typically P type. Thus, the termination may be formed with the same P type material as is used for the buried P regions below each trench. This is not recommended for an SiC implementation, however: aluminum is the preferred material for the P regions, because it is slow-diffusing in SiC and can thus limit lateral diffusion. The termination, on the other hand, is preferably fast-diffusing. As such, a fast-diffusing material such as boron is preferred for the termination around an SiC device.

As noted above, a high power switch is provided by employing an array of switch cells across a die. When so arranged, a switch as described herein can carry a current of at least 50 A with a die having a surface area of about 0.1 $cm^2$.

Figure 10:
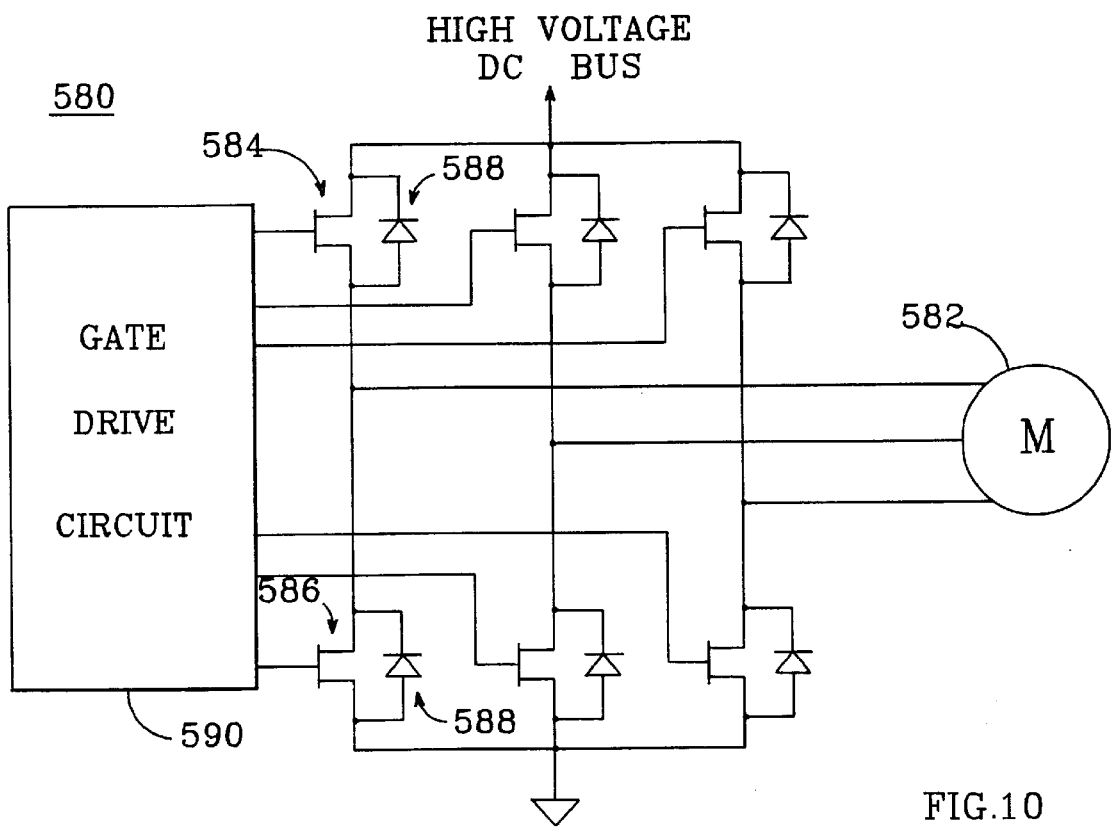
FIG. 10 is a schematic diagram of pulse-width modulated motor control circuit employing FET switches per the present invention.

One application of a switch per the present invention is illustrated in FIG. 10. As described in J. Baliga (ibid.) at p. 575–577, a PWM motor control circuit 580 provides variable frequency AC power to a 3-phase AC motor 582 using six switching transistors and six flyback diodes. Each switch is made from two transistors connected in a totem-pole configuration: one switch (typical of all the switches), is made from a pair of transistors 584, 586 per the present invention, connected in series between a high voltage DC bus and ground, with a flyback diode 588 connected across each transistor. The switching transistors are driven by a gate drive circuit 590, which regulates power to the motor by adjusting the time duration for the on and off states of each switch.

Ideally, the switching transistors used in a motor control circuit application have a high blocking voltage, a low on-resistance, fast switching speed and low switching losses. The FET switch described herein offers all of these characteristics, making it well-suited for use in a motor control circuit.

Figure 11:
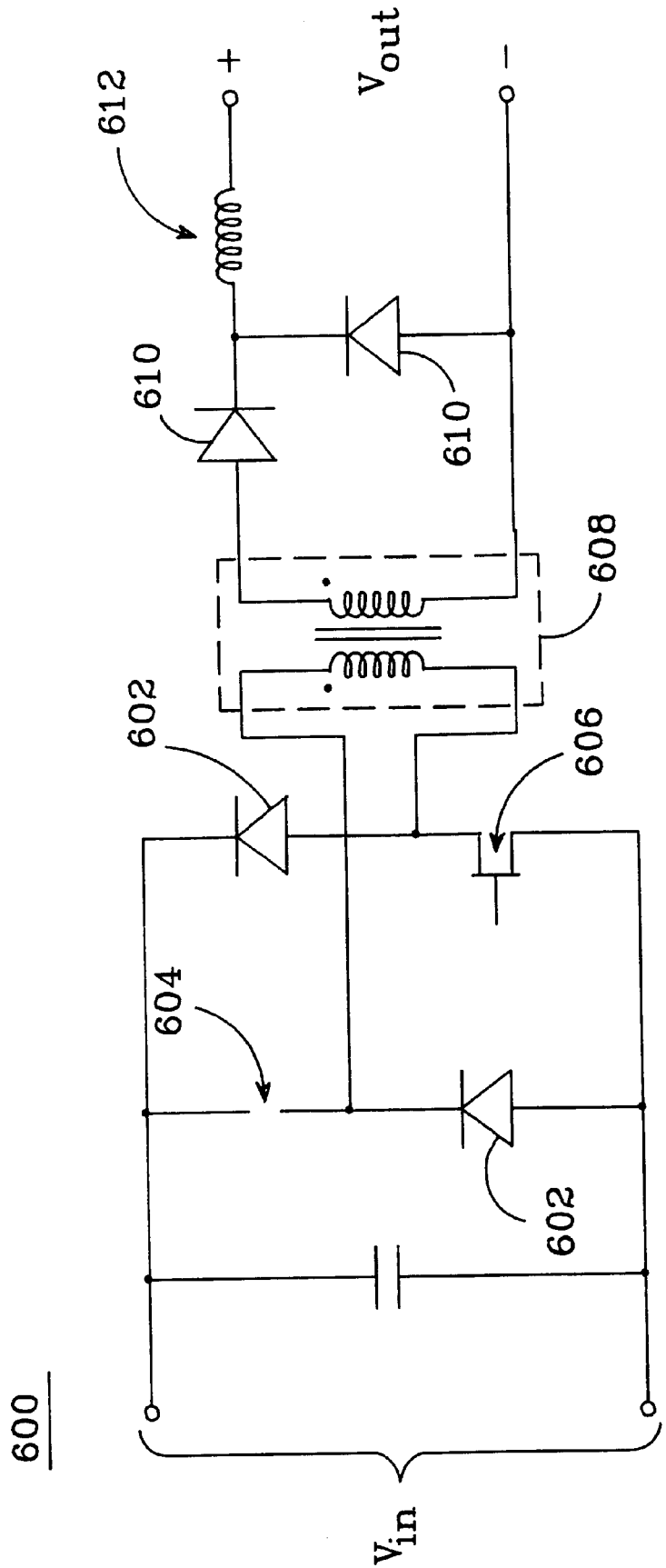
FIG. 11 is a schematic diagram of switching voltage regulator employing FET switches per the present invention.

Another suitable application for the present switch is shown in FIG. 11, which depicts a basic switching voltage regulator 600. Two rectifiers 602 are employed on the primary side of the regulator, connected in series with respective switching transistors 604 and 606; both transistor/rectifier branches are connected across an input voltage $V_{in}$. The switching transistors 604, 606 conduct a current through the primary side of a transformer 608 when switched on, and the rectifiers 602 conduct the transformer current when the transistors are switched off. Rectifiers 610 are connected to the secondary side of transformer 608 and, with output inductor 612, produce a rectified output voltage $V_{out}$ from the regulator. The switching transistors' fast switching speed and low switching losses make it well-suited for use in switching regulator applications.

The high power unipolar FET switch is fabricated using conventional means well-known to those in the art of semiconductor fabrication. Though the device's trench structures require processing steps that are not necessary when fabricating other switch types, such as planar MOSFETs, the additional fabrication complexity is offset by the greatly improved performance of the device when used in high power applications.

While particular embodiments of the invention have been shown and described, numerous variations and alternate embodiments will occur to those skilled in the art. Accordingly, it is intended that the invention be limited only in terms of the appended claims.

We claim:

1. A unipolar field-effect transistor (FET) switch having an associated rated breakdown voltage, comprising:
   an N– drift layer;
   a first N+ layer on said N– drift layer which provides an ohmic contact to said N– drift layer;
   a first layer of metal on said first N+ layer which provides a drain connection for said FET switch;
   a pair of trenches recessed into said N– drift layer opposite said N+ layer, said trenches separated by a mesa region comprised of that portion of said N– drift layer found between said pair of trenches;
   a layer of oxide lining the sides and bottom of each of said trenches to form oxide side-walls and respective oxide bottoms in each trench;
   a conductive material in each of said trenches;
   a second layer of metal connecting the conductive material in each of said trenches together which provides a gate connection for said FET switch;
   respective shallow P regions extending from the oxide bottoms of respective trenches into said N– drift layer, each of said shallow P regions extending around the corners formed at the intersections of its respective trench's oxide side-walls and its oxide bottom, said shallow P regions doped to provide an activated charge sufficient to prevent said shallow P regions from becoming completely depleted when subjected to said rated breakdown voltage;
   an epitaxial N type layer which completely envelops said shallow P regions and extends between said shallow P regions and which is-more heavily doped than said N– drift layer;
   a second N+ layer on said N– drift layer within said mesa region which provides an ohmic contact to said mesa region; and
   a third layer of metal contacting said second N+ layer which provides a source connection for said FET switch;
   the width and doping concentration of said mesa region arranged such that with no voltage applied to said gate connection said mesa region is completely depleted by the potentials created by the work function difference between said conductive material and the N– material in said mesa region, thereby making said switch normally-off,
      and such that a positive voltage applied to said gate connection undepletes said mesa region, creates accumulation channels adjacent to said oxide side-walls, and modulates said N– drift layer within said mesa region, thereby turning said switch on and enabling current to flow between said drain and said source connections via said mesa region and said accumulation channels,
      said accumulation channels, said ohmic contacts, and said mesa region modulation combining to provide a low on-resistance for said switch.

2. The unipolar FET switch of claim 1, wherein said conductive material is polysilicon which has been heavily-doped with acceptors.

3. The unipolar FET switch of claim 1, wherein said conductive material is a metal having a work function that is higher than that of the N– material in said mesa region.

4. The unipolar FET switch of claim 1, wherein said trenches are recessed vertically into said N– drift layer such that said side-walls are approximately perpendicular to the top surface of said drift layer.

5. The unipolar FET switch of claim 1, wherein said second N+ layer and said N− drift layer comprise a semiconductor material having a bandgap voltage greater than that of silicon.

6. The unipolar FET switch of ciaim 5, wherein said N+ layer and said N− drift layer comprise silicon carbide (siC).

7. The unipolar FET switch of claim 6, wherein said N− drift layer has a doping density of about $1 \times 10^{16}$ carriers/cm$^3$.

8. The unipolar FET switch of claim 6, wherein said N− drift layer has a thickness of about 12 μm and said switch has a blocking voltage of at least 1200 volts.

9. The unipolar FET switch of claim 6, wherein the activated charge of said shallow P regions is about $2 \times 10^{13}$ carriers/cm$^2$.

10. The unipolar FET switch of claim 6, wherein said shallow P regions comprise aluminum.

11. The unipolar FET switch of claim 5, wherein said N+ layer and said N− drift layer comprise gallium nitride (GaN).

12. The unipolar FET switch of claim 5, wherein said N+ layer and said N− drift layer comprise gallium arsenide (GaAs).

13. The unipolar FET switch of claim 5, wherein said N+ layer and said N− drift layer comprise diamond.

14. The unipolar FET switch of claim 1, wherein the doping concentration of the portion of said N− drift layer within said mesa region is lower than the doping concentration of the N− drift layer below said mesa region, said lower doping concentration enabling a wider mesa region to be completely depleted when said gate voltage is zero.

15. The unipolar FET switch of claim 1, wherein said second N+ layer and said N− drift layer comprise silicon and the activated charge of said shallow P regions is about $2 \times 10^{12}$ carriers/cm$^2$.

16. The unipolar FET switch of claim 1, wherein said N+ layer is a bulk substrate material and said N− drift layer is an epitaxial layer grown on said N+ layer.

17. The unipolar FET switch of claim 1, wherein said N− drift layer is a bulk substrate material and said N+ layer is implanted or diffused into the backside of said N− layer.

18. The unipolar FET switch of claim 1, wherein the depth of each of said trenches is between about 3 μm and 5 μm.

19. The unipolar FET switch of claim 1, wherein the width of each of said trenches is about 1–2 μm and the width of said mesa region is about 1–2 μm.

20. The unipolar FET switch of claim 1, wherein the structure between the vertical midpoints of each of said trenches comprises a FET cell, further comprising a plurality of additional trenches recessed in said drift layer and spaced periodically in said drift layer with said first pair of trenches, each of said additional trenches having oxide side-walls and an oxide bottom, a shallow P region at its bottom, and a conductive material within said trench, the conductive material in each of said additional trenches contacting said gate connection, each of said additional trenches forming an additional one of said FET cells, said additional FET cells increasing the current carrying capacity of said unipolar FET switch when said switch is turned on.

21. A unipolar field-effect transistor (FET) switch having an associated rated breakdown voltage, comprising:

a P− drift layer;

a first P+ layer on said P− drift layer which provides an ohmic contact to said P− drift layer;

a first layer of metal on said first P+ layer which provides a drain connection for said FET switch;

a pair of trenches recessed into said P− drift layer opposite said P+ layer, said trenches separated by a mesa region comprised of that portion of said P− drift layer found between said pair of trenches;

a layer of oxide lining the sides and bottom of each of said trenches to form oxide side-walls and respective oxide bottoms in each trench;

a conductive material in each of said trenches;

a second layer of metal connecting the conductive material in each of said trenches together which provides a gate connection for said FET switch;

respective shallow N regions extending from the oxide bottoms of respective trenches into said P− drift layer, each of said shallow N regions extending around the corners formed at the intersections of its respective trench's oxide side-walls and its oxide bottom, said shallow N regions doped to provide an activated charge sufficient to prevent said shallow N regions from becoming completely depleted when subjected to said rated breakdown voltage;

an epitaxial P type layer which completely envelops said shallow N regions and extends between said shallow N regions and which is more heavily doped than said P− drift layer;

a second P+ layer on said P− drift layer within said mesa region which provides an ohmic contact to said mesa region; and a third layer of metal contacting said second P+ layer which provides a source connection for said FET switch;

the width and doping concentration of said mesa region arranged such that with no voltage applied to said gate connection said mesa region is completely depleted by the potentials created by the work function difference between said conductive material and the P− material in said mesa region, thereby making said switch normally-off, and such that a negative voltage applied to said gate connection undepletes said mesa region, creates accumulation channels adjacent to said oxide side-walls, and modulates said P− drift layer within said mesa region, thereby turning said switch on and enabling current to flow between said drain and said source connections via said mesa region and said accumulation channels, said accumulation channels, said ohmic contacts, and said mesa region modulation combining to provide a low on-resistance for said switch.

22. The unipolar FET switch of claim 21, wherein said conductive material is polysilicon which has been heavily-doped with donors.

23. The unipolar FET switch of claim 21, wherein said second P+ layer and said P− drift layer comprise a semiconductor material having a bandgap voltage greater than that of silicon.

24. The unipolar FET switch of claim 23, wherein said second P+ layer and said P− drift layer comprise silicon carbide (SiC).

25. The unipolar FET switch of claim 24, wherein said P− drift layer has a thickness of about 12 μm and said switch has a blocking voltage of at least 1200 volts.

26. The unipolar FET switch of claim 21, wherein the doping concentration of the portion of said P− drift layer within said mesa region is lower than the doping concentration of the P− drift layer below said mesa region, said lower doping concentration enabling a wider mesa region to be completely depleted when said gate voltage is zero.

27. A unipolar field-effect transistor (FET) switch having an associated rated breakdown voltage, comprising:

an N− drift layer;

a first N+ layer on said N− drift layer which provides an ohmic contact to said N− drift layer;

a first layer of metal on said first N+ layer which provides a drain connection for said FET switch;

a pair of trenches recessed into said N− drift layer opposite said N+ layer, said trenches separated by a mesa region comprised of that portion of said N− drift layer found between said pair of trenches;

a layer of oxide lining the sides and bottom of each of said trenches to form oxide side-walls and respective oxide bottoms in each trench;

a conductive material in each of said trenches;

a second layer of metal connecting the conductive material in each of said trenches together which provides a gate connection for said FET switch;

respective shallow P regions extending from the oxide bottoms of respective trenches into said N− drift layer, each of said shallow P regions extending around the corners formed at the intersections of its respective trench's oxide side-walls and its oxide bottom, said shallow P regions doped to provide an activated charge sufficient to prevent said shallow P regions from becoming completely depleted when subjected to said rated breakdown voltage;

an epitaxial N type layer which completely envelops said shallow P regions and extends between said shallow P regions and which is more heavily doped than said N− drift layer;

a second N+ layer on said N− drift layer within said mesa region which provides an ohmic contact to said mesa region;

and a third layer of metal contacting said second N+ layer which provides a source connection for said FET switch;

the width and doping concentration of said mesa region arranged such that with no voltage applied to said gate connection said mesa region is not completely depleted by the potentials created by the work function difference between said conductive material and the N− material in said mesa region, thereby making said switch normally-on, such that a negative voltage applied to said gate connection completely depletes said mesa region and thereby blocks the flow of current between said drain and said source connections, and such that a positive voltage applied to said gate connection undepletes said mesa region, creates accumulation channels adjacent to said oxide side-walls, and modulates said N− drift layer within said mesa region, said accumulation channels, said ohmic contracts, and said mesa region modulation combining to provide a low on-resistance for said switch.

28. A high power unipolar field-effect transistor (FET) switch having an associated rated breakdown voltage, comprising:

an N− drift layer;

a first N+ layer on said N− drift layer which provides an ohmic contact to said N− drift layer;

a first layer of metal on said first N+ layer which provides a drain connection for said FET switch;

a plurality of trenches recessed into and spaced periodically in said drift layer opposite said N+ layer, each pair of adjacent trenches separated by a respective mesa region comprised of that portion of said N− drift layer found between said pair of adjacent trenches;

a layer of oxide lining the sides and bottom of each of said trenches to form oxide side-walls and respective oxide bottoms in each trench;

a conductive material in each of said trenches;

a second layer of metal connecting the conductive material in each of said trenches together which provides a gate connection for said FET switch;

respective shallow P regions extending from the oxide bottoms of respective trenches into said N− drift layer, each of said shallow P regions extending around the corners formed at the intersections of its respective trench's oxide side-walls and its oxide bottom, said shallow P regions doped to provide an activated charge sufficient to prevent said shallow P regions from becoming completely depleted when subjected to said rated breakdown voltage;

an epitaxial N type layer which completely envelops said shallow P regions and extends between said shallow P regions and which is more heavily doped than said N− drift layer;

respective second N+ layers on said N− drift layer within respective ones of said mesa regions which provide ohmic contacts to said mesa regions; and a third layer of metal contacting each of said second N+ layers which provides a source connection for said FET switch;

the width and doping concentration of said mesa regions arranged such that with no voltage applied to said gate connection said mesa regions are completely depleted by the potentials created by the work function difference between said conductive material and the N− material in said mesa regions, thereby making said switch normally-off, and such that a positive voltage applied to said gate connection undepletes said mesa regions, creates accumulation channels adjacent to said oxide side-walls, and modulates said N− drift layer within said mesa regions, thereby turning said switch on and enabling current to flow between said drain and said source connections via said mesa regions and said accumulation channels, said accumulation channels, said ohmic contacts, and said mesa region modulation combining to provide a low on-resisitance for said switch.

29. The high power unipolar FET switch of claim 28, wherein said first and second N+ layers and said N− drift layer comprise a semiconductor material having a bandgap voltage greater than that of silicon.

30. The high power unipolar FET switch of claim 29, wherein said first and second N+ layers and said N− drift layer comprise silicon carbide (SiC).

31. The high power unipolar FET switch of claim 30, wherein said N− drift layer has a thickness of about 12 $\mu$m and said FET switch has a blocking voltage of at least 1200 volts.

32. The high power unipolar FET switch of claim 29, wherein said first and second N+ layers and said N− drift layer comprise gallium nitride (GaN).

33. The high power unipolar FET switch of claim 29, wherein said first and second N+ layers and said N− drift layer comprise gallium arsenide (GaAs).

34. The high power unipolar FET switch of claim 29, wherein said first and second N+ layers and said N− drift layer comprise diamond.

35. The high power unipolar FET switch of claim 28, wherein the doping concentration of the portions of said N− drift layer within said mesa regions is lower than the doping concentration of the N− drift layer below said mesa regions, said lower doping concentration enabling wider mesa regions to be completely depleted when said gate voltage is zero.

36. The high power unipolar FET switch of claim 28, wherein said conductive material is polysilicon which has been heavily-doped with acceptors.

37. The high power unipolar FET switch of claim 28, wherein said conductive material is a metal having a work function that is higher than that of the N− material in said mesa region.

38. The high power unipolar FET switch of claim 28, wherein said switch resides on a die in which said drift layer, said first N+ layer and said first metal layer run the length and width of said die.

39. The high power unipolar FET switch of claim 38, wherein each of said trenches is a channel which runs the length of said die and said trenches are spaced periodically across the width of said die.

40. The high power unipolar FET switch of claim 38, wherein each of said mesa regions is approximately cylindrical about a vertical axis, said mesa regions spaced periodically within said die.

41. The high power unipolar FET switch of claim 38, wherein the perimeter of each of said mesa regions describes a polygon, said mesa regions spaced periodically within said die.

42. The high power unipolar FET switch of claim 41, wherein said polygon is a hexagon.

43. The high power unipolar FET switch of claim 38, wherein said first N+ layer is a bulk substrate material and said N− drift layer is an epitaxial layer grown to a desired thickness on said first N+ layer.

44. The high power unipolar FET switch of claim 38, wherein said N− drift layer is a bulk substrate material and said first N+ layer is implanted or diffused into the backside of said N− drift layer and has a thickness of less than about 0.5 μm.

45. The high power unipolar FET switch of claim 38, wherein the surface area of said die is about 0.1 cm$^2$ and said FET switch can accommodate a current of at least 50 A when turned on.

46. A pulse-width modulated motor control circuit, comprising:
at least one pair of switching transistors connected in a totem-pole configuration between a supply voltage and ground, the junction between said transistors providing an output suitable for connection to an AC motor;
respective flyback rectifiers connected across respective ones of said switching transistors, each of said switching transistors having an associated rated breakdown voltage and comprising:
an N− drift layer,
a first N+ layer on said N− drift layer which provides an ohmic contact to said N− drift layer,
a first layer of metal on said first N+ layer which provides a drain connection for said FET switch,
a pair of trenches recessed into said N− drift layer opposite said N+ layer, said trenches separated by a mesa region comprised of that portion of said N− drift layer found between said pair of trenches,
a layer of oxide lining the sides and bottom of each of said trenches to form oxide side-walls and respective oxide bottoms in each trench,
a conductive material in each of said trenches,
a second layer of metal connecting the conductive material in each of said trenches together which provides a gate connection for said FET switch,
respective shallow P regions extending from the oxide bottoms of respective trenches into said N− drift layer, each of said shallow P regions extending around the corners formed at the intersections of its respective trench's oxide side-walls and its oxide bottom, said shallow P regions doped to provide an activated charge sufficient to prevent said shallow P regions from becoming completely depleted when subjected to said rated breakdown voltage,
an epitaxial N type layer which completely envelops said shallow P regions and extends between said shallow P regions and which is more heavily doped than said N− drift layer,
a second N+ layer on said N− drift layer within said mesa region which provides an ohmic contact to said mesa region, and
a third layer of metal contacting said second N+ layer which provides a source connection for said FET switch,
the width and doping concentration of said mesa region arranged such that with no voltage applied to said gate connection said mesa region is completely depleted by the potentials created by the work function difference between said conductive material and the N− material in said mesa region, thereby making said switch normally-off,
and such that a positive voltage applied to said gate connection undepletes said mesa region, creates accumulation channels adjacent to said oxide side-walls, and modulates said N− drift layer within said mesa region, thereby turning said switch on and enabling current to flow between said drain and said source connections via said mesa region and said accumulation channels,
said accumulation channels, said ohmic contacts, and said mesa region modulation combining to provide a low on-resistance for said switch; and
a gate drive circuit which controls the on and off states of each of said switching transistors to regulate the power provided to said motor.

47. A switching voltage regulator, comprising
a first switching transistor and a first rectifier connected in series across an input voltage;
a second switching transistor and a second rectifier connected in series across an input voltage;
a transformer, said first and second switching transistors connected to conduct a current through the primary side of said transformer when switched on, and said first and second rectifiers connected to conduct said transformer current when said transistors are switched off;
an output circuit connected to the secondary side of said transformer and containing at least one output rectifier, said output circuit arranged to rectify the voltage across said secondary side of said transformer and to produce a rectified output voltage;
each of said first and second switching transistors having an associated rated breakdown voltage and comprising:
an N− drift layer,
a first N+ layer on said N− drift layer which provides an ohmic contact to said N− drift layer,
a first layer of metal on said first N+ layer which provides a drain connection for said FET switch, a pair of trenches recessed into said N− drift layer opposite said N+ layer, said trenches separated by a mesa region comprised of that portion of said N− drift layer found between said pair of trenches, a layer of oxide lining the sides and bottom of each of said trenches to form oxide side-walls and respective oxide bottoms in each trench, a conductive material in each of said trenches, a second layer of metal connecting the conductive material in each of said trenches together which provides a gate connection for said FET switch, respective shallow P regions extending from the oxide bottoms of respective trenches into said N− drift layer, each of said shallow P regions extending around the corners formed at the intersections of its respective trench's oxide side-walls and its oxide bottom, said shallow P regions doped to provide an activated charge sufficient to prevent said shallow P regions from becoming completely depleted when subjected to said rated breakdown voltage, an epitaxial N type layer which completely envelops said shallow P regions and extends between said shallow P regions and which is more heavily doped than said N− drift layer, a second N+ layer on said N− drift layer within said mesa region which provides an ohmic contact to said mesa region, and a third layer of metal contacting said second N+ layer which provides a source connection for said FET switch, the width and doping concentration of said mesa region arranged such that with no voltage applied to said gate connection said mesa region is completely depleted by the potentials created by the work function difference between said conductive material and the N− material in said mesa region, thereby making said switch normally-off, and such that a positive voltage applied to said gate connection undepletes said mesa region, creates accumulation channels adjacent to said oxide side-walls, and modulates said N− drift layer within said mesa region, thereby turning said switch on and enabling current to flow between said drain and said source connections via said mesa region and said accumulation channels, said accumulation channels, said ohmic contacts, and said mesa region modulation combining to provide a low on-resistance for said switch.

* * * * *